United States Patent [19]

Bullock et al.

[11] Patent Number: 4,673,873
[45] Date of Patent: Jun. 16, 1987

[54] IDENTICAL LEFT-RIGHT CURRENT STATORS FOR POLYPHASE WATTHOUR METER

[75] Inventors: Donald F. Bullock, Somersworth; Austin F. Wilson, Rochester, both of N.H.

[73] Assignee: General Electric Company, Somersworth, N.H.

[21] Appl. No.: 711,716

[22] Filed: Mar. 14, 1985

[51] Int. Cl.⁴ .................... G01R 11/02; H01F 17/04
[52] U.S. Cl. .................................. 324/137; 324/107; 336/221
[58] Field of Search .................. 336/225, 221, 223; 361/157; 324/137, 107, 144

[56] References Cited

U.S. PATENT DOCUMENTS

| | | | |
|---|---|---|---|
| 2,909,729 | 10/1959 | Wallace | 324/107 |
| 3,188,591 | 6/1965 | Dortort | 336/225 |
| 3,290,594 | 12/1966 | Drew | 324/107 |
| 3,863,183 | 1/1975 | Kranz | 336/225 |

Primary Examiner—Reinhard J. Eisenzopf
Assistant Examiner—Jose M. Solis
Attorney, Agent, or Firm—Robert E. Brunson; Thomas R. Morrison

[57] ABSTRACT

A polyphase, socket-style meter employs identical left and right current stators. The angles about the meter disk, at which the left and right current stators are located, are adjusted to place the centers of their cores in alignment with their connector tabs. Identical current stator coils encircle the cores. The axes of the cores are slightly skewed with respect to the axes of the coils. The diameters of the coil helices are made large enough to accommodate the skew.

7 Claims, 4 Drawing Figures

IDENTICAL LEFT-RIGHT CURRENT STATORS FOR POLYPHASE WATTHOUR METER

BACKGROUND OF THE INVENTION

The present invention relates to watthour meters and, more particularly, to current stators for watthour meters and their interface with the remainder of the meter.

Conventional electro-mechanical watthour meters employ a conductive metal disk rotated as the rotor of a small induction motor by interaction with fluxes generated by opposed voltage and current stators. When the fluxes produced by the voltage and current stators are in quadrature, the rotational torque experienced by the disk is proportional to the voltage applied to the load multiplied by the current consumed by the load; that is, the power consumed by the load. Disk rotation is magnetically resisted in proportion to its rotational speed. Thus, the disk speed is proportional to the power consumed by the load. Each rotation of the disk represents a predetermined increment of energy consumed. The rotations of the disk are accumulated over time in a mechanical or electronic accumulator, or register, for billing purposes by the utility supplying the power.

Although watthour meters are precision measuring instruments, they are manufactured in a volume measured in the millions per year. Several manufacturers are engaged in the business of manufacturing watthour meters and such manufacturers keenly compete for the business. Therefore, for a manufacturer to maintain its position in the industry, it is imperative that it find more efficient ways to produce such watthour meters.

Manufacturing efficiency is improved by reducing the number of different types of parts which must be manufactured. For example, two different parts may be replaced by two identical parts, each capable of performing the function of the part it replaces. This assists in several ways. First, only a single part must be designed. Second, manufacturing runs of twice the length are possible to produce the desired amount of identical parts rather than two shorter runs to produce the two different parts. Third, the machine setup time between runs to produce two different parts, during which the manufacturing asset is idle, is eliminated. Finally, two separately catalogued and stocked parts are replaced with a single catalog and stock item.

It is conventional in polyphase watthour meters to provide two or three sets of opposed current and voltage stators spaced about the circumference of the meter disk to drive the meter at a speed proportional to the total power delivered to the load through all three phases of a three-phase line. At a minimum, a first set of voltage and current stators is disposed at the right of the meter, as viewed from the front, and a second set of voltage and current stators is disposed at the left of the meter. When a third set of voltage and current stators is used, they are disposed at the rear of the meter, angularly spaced midway between the left and right sets of voltage and current stators. For convenience in the following description, these sets of voltage and current stators are referred to as the right, left and rear sets.

The style of watthour meter with which the present invention is principally concerned is one which plugs directly into a socket behind it. This is effected by connector blades extending rearward from the meter which are inserted into contacts in the socket. In order to permit interchangeability between meters of different manufacturers, the external interface between all socket-style watthour meters is rigidly specified by the American National Standard Institute, hereafter ANSI. That is, the dimensions and spacing of the connector blades are beyond the control of the meter manufacturer. The internal arrangement of a watthour meter, in contrast, is subject to performance specifications but the physical arrangement is generally under the control of the manufacturer.

The left and right current stators in a two-stator meter are generally mirror images of each other. They are positioned about 180 degrees apart around the circumference of the disk. Since they are mirror images, the left and right current stators are different parts requiring separate design, manufacture, catalog and stock. Substantial economies would result from replacing two different current stators with two identical current stators while maintaining rigid adherence to the ANSI interface standard.

OBJECTS AND SUMMARY OF THE INVENTION

Accordingly, it is an object of the invention to provide a watthour meter having identical left and right current stators.

It is a further object of the invention to provide identical left-right current stators while maintaining rigid adherence to ANSI interface standards.

It is a still further object of the invention to provide a watthour meter having identical left and right current stators in which the angular spacing between the current stators is adjusted to align a center of each current stator core with the base slots through which project the connecting tabs of current stator windings.

Briefly stated, the present invention provides a polyphase, socket-style meter employing identical left and right current stators. The angles about the meter disk, at which the left and right current stators are located, are adjusted to place the centers of their cores in alignment with their connector tabs. Identical current stator coils encircle the cores. The axes of the cores are slightly skewed with respect to the axes of the coils. The diameters of the coil helices are made large enough to accommodate the skew.

According to an embodiment of the invention, there is provided a current stator for a watthour meter comprising a magnetic stator core having an opening, a stator coil wound through the opening, the magnetic stator core being symmetrical about its center, a line current conductor and a load current conductor connected to the stator coil, a line current connector tab at an end of the line current conductor, a load current connector tab at an end of the load current conductor, the line current connector tab and the load current connector tab being vertically aligned with each other, and an axis of the line current connector tab and the load current connector tab being aligned with the center.

According to a feature of the invention, there is provided a polyphase watthour meter comprising a rotatable metallic disk, a left current stator having a left current stator core adjacent a first surface of the metallic disk, a left voltage stator adjacent a second surface of the metallic disk opposed to the left current stator, the left current stator and the left voltage stator being disposed at a first angular position about the metallic disk, a right current stator having a right current stator core adjacent the first surface at a second angular position about the metallic disk, the second angular position being spaced a predetermined separation angle from the first angular position, a right voltage stator adjacent the second surface opposed to the right current stator, a left current stator coil wound in the left current stator core, a left line current conductor connected to the left current stator coil and terminating in a left line current connector tab, a left load current conductor connected to the left current stator coil and terminating in a left load current connector tab, the left line current connector tab and left load current connector tab being aligned parallel to each other and being separated by a first standard distance, a right current stator coil wound in the right current stator core, a right line current conductor connected to the right current stator coil and terminating in a right line current connector tab, a right load current conductor connected to the right current stator coil and terminating in a right load current connector tab, the right line current connector tab and right load current connector tab being aligned parallel to each other and being separated by the first standard distance, the left load current connector tab and the right load current connector tab being separated by a second standard distance, the left line current connector tab and the right line current connector tab being separated by the second standard distance, the predetermined separation angle being effective to position centers of the left current stator core and the right current stator core the second standard distance apart, and a diameter of the left current stator coil and the right current stator coil being large enough to permit a skew of the left current stator core and the right current stator coil, respectively, whereby a common part may be used for the left current stator and the right current stator.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
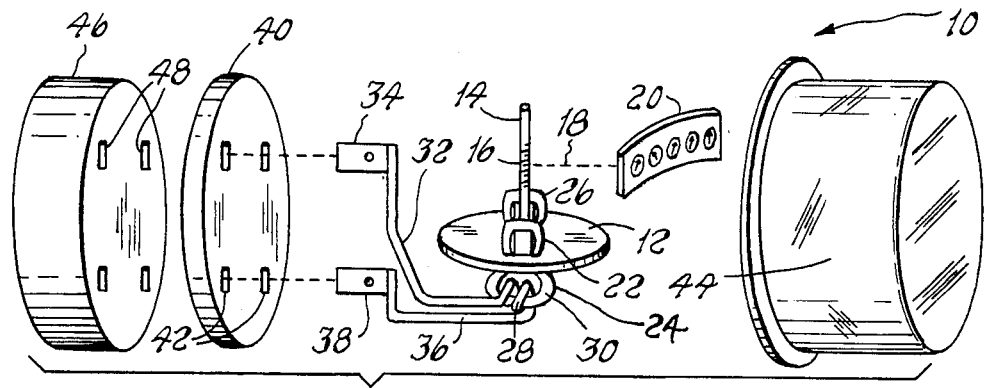
FIG. 1 is a simplified exploded view of a watthour meter from which items unnecessary to the description are omitted.

Referring to FIG. 1, there is shown, generally at 10, a polyphase watthour meter according to an embodiment of the invention. A metallic disk 12 is rotatably supported on a shaft 14 by conventional bearings (not shown). A worm 16, formed in shaft 14, is connected by mechanical gearing, indicated by a dashed line 18, to a conventional mechanical register 20. A left voltage stator 22 is disposed above metallic disk 12 opposed to a left current stator 24 below metallic disk 12. A right voltage stator 26 is disposed above metallic disk 12 opposed to a right current stator below metallic disk 12 (hidden in FIG. 1). Elements of left current stator 24 include a left current stator coil 28 having one, two or more turns of heavy copper conductor through a left current stator core 30. The number of turns in left current stator coil 28 is generally proportional to the current rating of watthour meter 10. A left line current conductor 32 from left current stator core 30 is connected to a left line current connector tab 34. A left load current conductor 36 from left current stator core 30 is connected to a left load current connector tab 38. Similarly, a corresponding right current stator coil, right current stator core, right line current conductor, right load current conductor, right line current connector tab and right load current connector tab are also present but are hidden and not visible in the figure.

The foregoing elements are conventionally mounted on a meter frame which is omitted from FIG. 1 to avoid obscuring the elements requiring description.

A base 40, conventionally of a plastic resin, includes a plurality of slots 42 through which protrudes each connector tab, and which determines the position of each connector tab according to the ANSI standard. A transparent cover 44, conventionally of glass or transparent plastic, mates with base 40 to enclose the remainder of watthour meter 10.

A socket 46 includes connectors 48, disposed according to ANSI standards, to provide electrical connection to all connector tabs extending from base 40 by mere linear insertion of the connector tabs into connectors 48.

Figure 2:
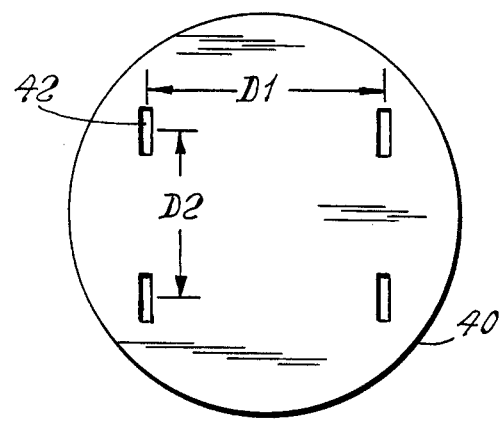
FIG. 2 is a rear view of a standard meter base of FIG. 1.

Referring now to FIG. 2, a rear view of base 40 is shown. A center-to-center horizontal spacing D1 between the connector current tabs for the left and right current stator coils is rigidly controlled. In addition, a center-to-center vertical spacing D2 between the line and load current connector tabs of each current stator coil is also rigidly controlled. Spacings D1 and D2 are rigidly specified in the ANSI standards. In order to permit use of identical current stators in left and right locations, accommodation must be made for this mandated spacing.

It will be recognized that additional slots 42 may be provided for connector tabs to connect left voltage stator 22 and right voltage stator 26 across the line voltage. Such additional slots 42 are conventional, have many possible embodiments, and are not considered of concern to the present invention. Illustration and description of such additional slots 42 are therefore omitted.

Figure 3:
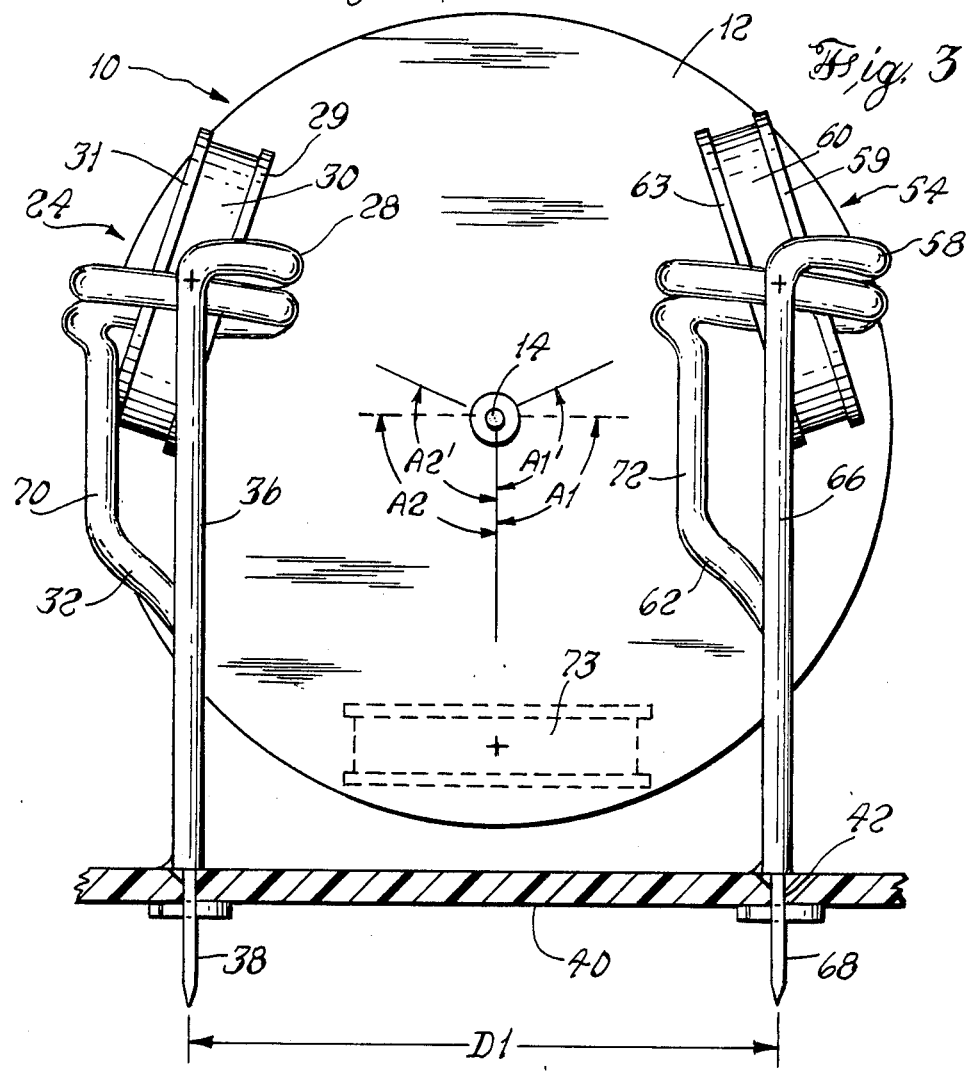
FIG. 3 is a bottom view of the watthour meter of FIG. 1 wherein items unnecessary to the description are omitted.

Referring now to FIG. 3, a bottom view of watthour meter 10 is shown in which elements of a right current stator 54 include a right current stator coil 58, right current stator core 60, right line current conductor 62, right load current connector tab 68, right line current connector tab 64 (hidden by right load current connector tab 68) and right load current conductor 66, corresponding to elements 28, 30, 32, 34, 38 and 36, respectively, of left current stator 24.

Normally, it is desirable to use as large a diameter metallic disk 12 with left current stator 24 and right current stator 54 (as well as their opposed voltage stators, not shown) at as large a radius as possible in order to increase the available torque for a given burden on the system power. This normally places the centers of left current stator core 30 and right current stator core 60 farther apart than spacing D1. Thus, a left dog-leg (not shown) is needed in left load current conductor 36 and left line current conductor 32, and a right dog-leg (also not shown) is needed in right line current conductor 62 and right load current conductor 66. This, of course, makes the parts different. In addition, it is customary to make one of left current stator coil 28 and right current stator coil 58 in a right-hand helix and the other thereof in a left-hand helix in order to obtain the same direction of torque on metallic disk 12. This reinforces the need for different parts.

Finally, it has been common practice to use asymmetric elements for load shunts on left and right stator cores 30 and 60. That is, a different number or type of magnetic and non-magnetic elements is frequently used on a load shunt 31 on the radially outer side of left stator core 30 than on a radially inner load shunt 29. A reverse arrangement is conventionally used on right stator core 60. Since load shunt 29 is closer to the center of disk 12 than is load shunt 31, the contributions of the two load shunts to torque on disk 12 are different. If left stator core 30 were repositioned to replace right stator core 60, the inside and outside relationships of load shunts 29 and 31 would be reversed. Thus, an attempt to use left current stator 30 both in the left position shown and in the right position to replace right current stator 60 would produce different torques and would thus lead to substantial measurement errors. A similar asymmetric construction of load shunts 59 and 63 on right current stator core 60 makes right current stator core 60 unusable in the position occupied by left stator core 30.

In the preferred embodiment of the invention, left current stator core 30 and right current stator core 60 are identical. In order to avoid the above unequal contributions to disk torque due to asymmetry of load shunts, the two load shunts on each current stator core are mirror images of each other. In this way, identical parts used for current stators 30 and 60 are capable of developing substantially identical torque over their entire range of load current.

Load shunts, per se, are well known in the art. One skilled in the art, in the light of the foregoing disclosure, would be fully enabled to construct and use mirror-image load shunts according to the invention. Thus, a further extended discussion of the structure of load shunts 29, 31, 59 and 63 is omitted herefrom.

The position of a rear current stator 73 (which is not of concern to the present application and is assumed to be omitted in the embodiment of watthour meter 10 shown) is shown in dashed line. Centers of rear current stator 73, right current stator core 60 and left current stator core 30 are indicated by crosses. An angle A1 between radii of metallic disk 12, passing through the centers of rear current stator 73, and right current stator core 60, is usually 90 degrees. Similarly, an angle A2 between the radii of metallic disk 12, passing through the centers of rear current stator 73 and left current stator core 30, is also usually 90 degrees. By increasing angles A1 and A2 to greater angles A1' and A2', the centers of right current stator core 60 and left current stator core 30 can be moved inward to position them apart the spacing D1 where they are aligned with the axes of right load current connector tab 68 and left load current connector tab 38, respectively.

In order to position left current stator 24 and right current stator 54 at the angles shown, left current stator core 30 and right current stator core 60 must be skewed an equal amount with respect to the axes of left load current connector tab 38 and right load current connector tab 68. This skew is accommodated by providing a helical radius of left current stator coil 28 and right current stator coil 58 which is larger than the portions of left current stator core 30 and right current stator core 60 about which they are wound, thus permitting the skew to occur. In addition, left current stator coil 28 and right current stator coil 58 describe slightly less than two full turns. This provides an offset portion 70 on left line current conductor 32 and an identical offset portion 72 on right line current conductor 62. In the case of left current stator coil 28, in particular, this provides clearance for the rearward end of left current stator core 30.

Since the skew of left current stator core 30 and right current stator core 60 is about their centers, its effect is equal on left current stator 24 and right current stator 54. The current shunts, and other elements, of left current stator core 30 and right current stator core 60 are made symmetrical about their center lines. In this way, left current stator core 30 and right current stator core 60 are made interchangeable. Since both left current stator coil 28 and right current stator coil 58 and left current stator core 30 and right current stator core 60 are identical, left current stator 24 is identical to, and thus interchangeable with, right current stator 54.

Although different diameters of metallic disk 12 may require different values of skew, in the preferred embodiment angles A1' and A2' each are about 100 degrees and the skew is therefore about 10 degrees. The sum of angles A1' and A2' is about 200 degrees.

Not only is it permissible to skew left current stator core 30 and right current stator core 60, but such skew offers a benefit, especially when used in a three-stator meter which includes rear current stator 73. The increases in angles A1' and A2' over conventional angles A1 and A2 reduces the interference between eddy currents produced by each of the opposed sets of voltage and current stators with flux from the adjacent set of voltage and current stators. Such interference may produce speed errors in metallic disk 12 which could result in measurement errors by watthour meter 10.

One skilled in the art would recognize that, unless a slight change is made, left current stator 24 tends to drive metallic disk 12 in the direction opposite to the direction in which right current stator 54 drives it. Such slight change requires only a reversal of the voltage leads to one of left voltage stator 22 or right voltage stator 26 (FIG. 1). This results in both left current stator 24 and right current stator 54 producing torque in the same rotational direction. Voltage stator connections are generally slip-on connectors designed to carry a small current. Thus, their reversal is a trivial assembly operation.

The foregoing discussion should not be construed to exclude an embodiment of the invention wherein angles A1' and A2' are each 90 degrees. Although this displaces the centers of left and right current stator cores 30 and 60 to the left and right, respectively, of the points marked by crosses, such displacements are permissible as long as physical contact between the respective coils and cores is avoided. The axes of left current stator coil 28 and right current stator coil 58, marked by crosses, are aligned with the axes of left and right load current connector tabs 38 and 69, respectively. The diameters of left and right current stator coils 28 and 58 are enlarged to avoid contact with their respective cores. Any electrical or magnetic imbalance which may result from displacing left and right current stator cores 30 and 60 outward with respect to the axes of their coils is equally present on each side and therefore does not interfere with equal production of torque in the two locations.

Figure 4:
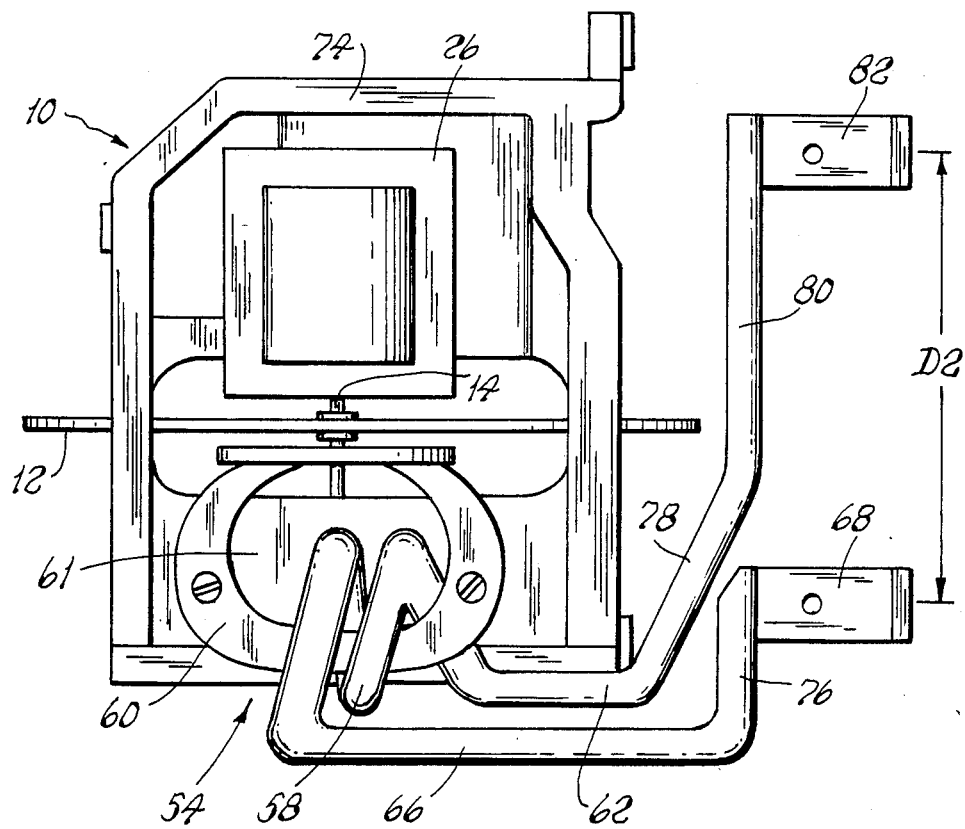
FIG. 4 is a right side view of the watthour meter of FIG. 1.

Referring now to FIG. 4 showing the right side of watthour meter 10, a frame 74 supports right voltage stator 26 and right current stator 54. Right current stator coil 58 is wound through an opening 61 in right current stator 54. The cross section of right current stator core 60 is relatively small with respect to the diameter of right current stator coil 58. This permits right current stator coil 58 to skew within opening 61 without mechanical contact between right current stator coil 58 and right current stator core 60.

A rearward end of right load current conductor 66 terminates in a vertical portion 76 which positions right load current connector tab 68 at the correct height to pass through the appropriate slot 42 (FIGS. 2 and 3). Right line current conductor 62 includes a diagonal portion 78 which permits clearance between itself and vertical portion 76. A vertical portion 80 is included between diagonal portion 78 and a right line current connector tab 82 to position right line current connector tab 82 the spacing D2 above right load current connector tab 68. Thus, all of the ANSI current-connection interface requirements are satisfied.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A current stator for a watthour meter comprising:
    a magnetic stator core having an opening;
    a stator coil wound through said opening;
    said magnetic stator core being symmetrical about its center;
    a line current conductor and a load current conductor connected to said stator coil;
    a line current connector tab at an end of said line current conductor;
    a load current connector tab at an end of said load current conductor;
    said line current connector tab and said load current connector tab being vertically aligned with each other; and
    an axis of said line current connector tab and said load current connector tab being aligned with an axis of said stator coil.

2. A current stator according to claim 1 wherein a vertical spacing between said line current connector tab and said load current connector tab satisfies a standard of the American National Standards Institute.

3. A current stator according to claim 1 wherein said center of said magnetic stator core is aligned with said axis of said line current connector tab and said load current connector tab.

4. A current stator comprising:
    a magnetic stator core having an opening;
    a stator coil wound through said opening;
    said magnetic stator core being symmetrical about its center;
    a line current conductor and a load current condcutor connected to said stator coil;
    a line current connector tab at an end of said line current conductor;
    a load current connector tab at an end of said load current conductor;
    said line current connector tab and said load current connector tab being vertically aligned with each other;
    an axis of said line current connector tab and said load current connector tab being aligned with an axis of said stator coil; and
    said center of said magnetic stator core being transversely displaced from said axis of said stator coil.

5. A polyphase watthour meter comprising:
    a rotatable metallic disk;
    a left current stator having a left current stator core adjacent a first surface of said metallic disk;
    a left voltage stator adjacent a second surface of said metallic disk opposed to said left current stator;
    said left current stator and said left voltage stator being disposed at a first angular position about said metallic disk;
    a right current stator having a right current stator core adjacent said first surface at a second angular position about said metallic disk, said second angular position being spaced a predetermined separation angle from said first angular position;
    a right voltage stator adjacent said second surface opposed to said right current stator;
    a left current stator coil wound in said left current stator core;
    a left line current conductor connected to said left current stator coil and terminating in a left line current connector tab;
    a left load current conductor connected to said left current stator coil and terminating in a left load current connector tab;
    said left line current connector tab and left load current connector tab being aligned parallel to each other and being separated by a first standard spacing;
    a right current stator coil wound in said right current stator core;
    a right line current conductor connected to said right current stator coil and terminating in a right line current connector tab;
    a right load current conductor connected to said right current stator coil and terminating in a right load current connector tab;
    said right line current connector tab and right load current connector tab being aligned parallel to each other and being separated by said first standard spacing;
    said left load current connector tab and said right load current connector tab being separated by a second standard spacing;
    said left line current connector tab and said right line current connector tab being separated by said second standard spacing;
    said predetermined separation angle being effective to position centers of said left current stator coil and said right current stator coil said second standard spacing apart; and
    a diameter of said left current stator coil and said right current stator coil being large enough to permit at least one of a displacement and a skew of said left current stator core and said right current stator coil respectively, whereby a common part may be used for said left current-stator and said right current stator.

6. A polyphase watthour meter according to claim 5 wherein said first and second standard spacings are distances specified by the American National Standards Institute.

7. A polyphase watthour meter according to claim 5 wherein said predetermined separation angle is about 200 degrees.

* * * * *